United States Patent
Takewaki

(10) Patent No.: US 8,053,863 B2
(45) Date of Patent: Nov. 8, 2011

(54) ELECTRICAL FUSE AND SEMICONDUCTOR DEVICE

(75) Inventor: Toshiyuki Takewaki, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 263 days.

(21) Appl. No.: 12/461,159

(22) Filed: Aug. 3, 2009

(65) Prior Publication Data

US 2010/0032797 A1 Feb. 11, 2010

(30) Foreign Application Priority Data

Aug. 11, 2008 (JP) ................... 2008-207361

(51) Int. Cl.
*H01L 29/00* (2006.01)
(52) U.S. Cl. ........ 257/529; 257/209; 257/665; 257/767; 257/775; 257/E23.149
(58) Field of Classification Search ............ 257/209, 257/529, 665, 767, 773, 775, E23.146, E23.149, 257/E23.15
See application file for complete search history.

(56) References Cited

U.S. PATENT DOCUMENTS

| | | |
|---|---|---|
| 2004/0262710 A1 | 12/2004 | Ueda |
| 2006/0263986 A1 | 11/2006 | Mori et al. |
| 2008/0169529 A1* | 7/2008 | Kim et al. ............. 257/529 |
| 2009/0051003 A1* | 2/2009 | Cheng et al. .......... 257/529 |
| 2009/0146251 A1 | 6/2009 | Ueda |
| 2009/0206446 A1* | 8/2009 | Russ et al. ............ 257/529 |

FOREIGN PATENT DOCUMENTS

| | | |
|---|---|---|
| JP | 2001-68475 A | 3/2001 |
| JP | 2004-304002 A | 10/2004 |
| JP | 2005-39220 A | 2/2005 |

* cited by examiner

*Primary Examiner* — Matthew E Warren

(74) *Attorney, Agent, or Firm* — McGinn IP Law Group, PLLC

(57) ABSTRACT

An electrical fuse comprises: an interconnect to be cut; and a first terminal and a second terminal which are respectively provided at both ends of the interconnect to be cut. The interconnect to be cut comprises: a first orientation film which contains copper as a main component and is oriented in a (111) plane; and a second orientation film which contains copper as a main component and is oriented in a (511) plane. The second orientation film is provided inside the first orientation film over a width direction of the first orientation film, which is perpendicular to a direction from the first terminal toward the second terminal, so as to partition the first orientation film. Accordingly, it becomes possible to securely cut the electrical fuse whose constituent material is copper, and moreover, to maintain a satisfactory cut state of the electrical fuse after the cutting.

8 Claims, 7 Drawing Sheets

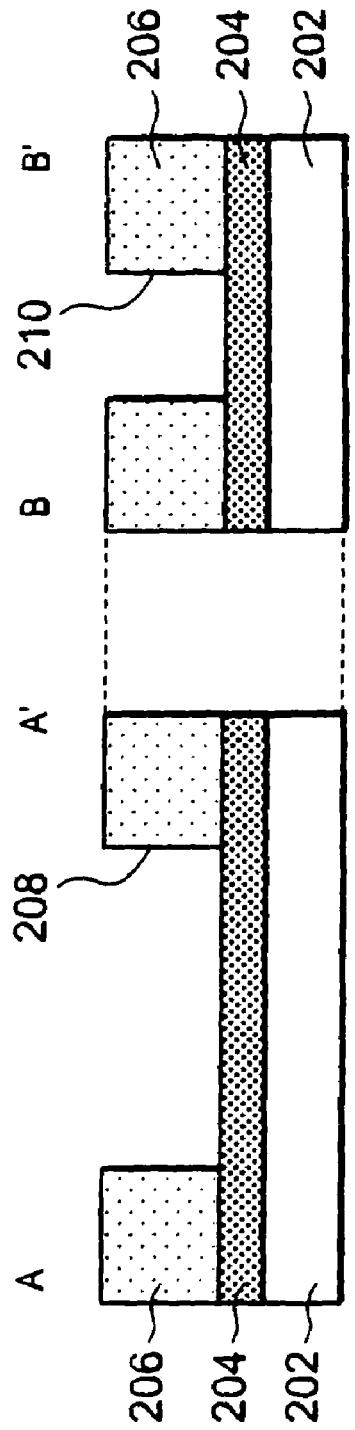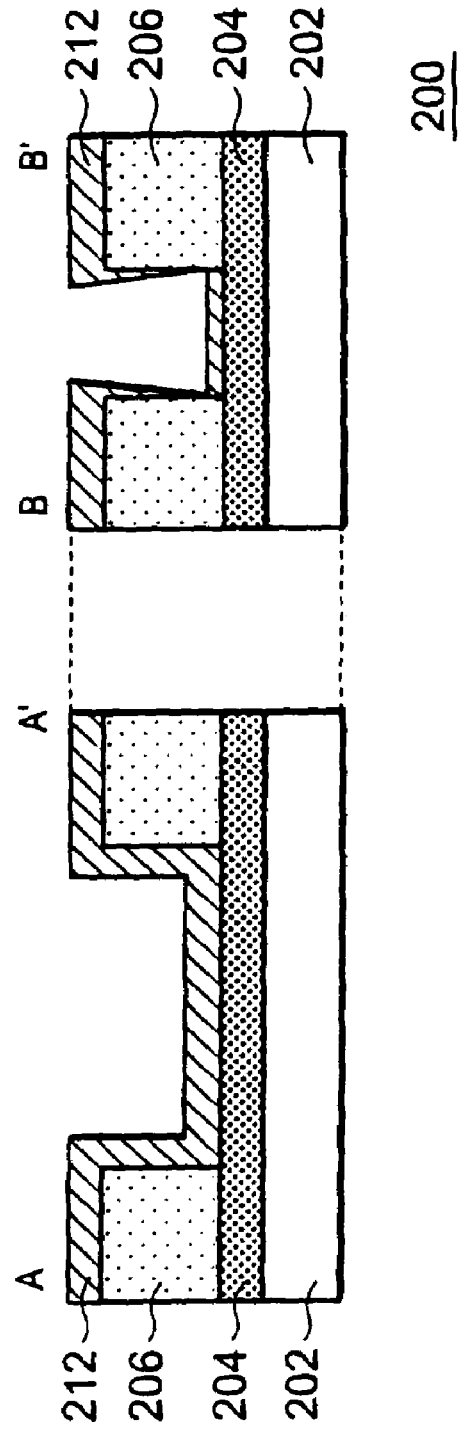

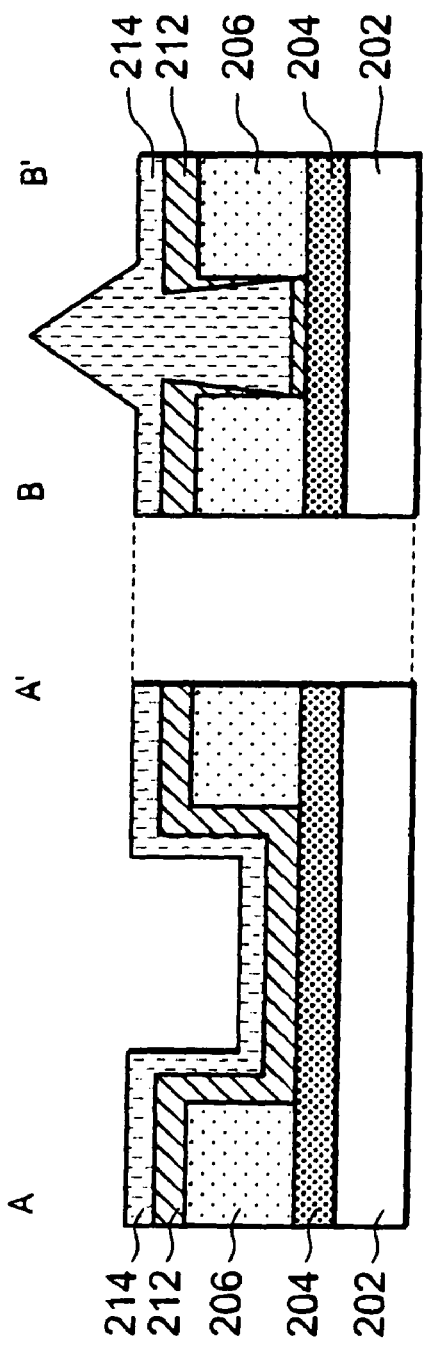
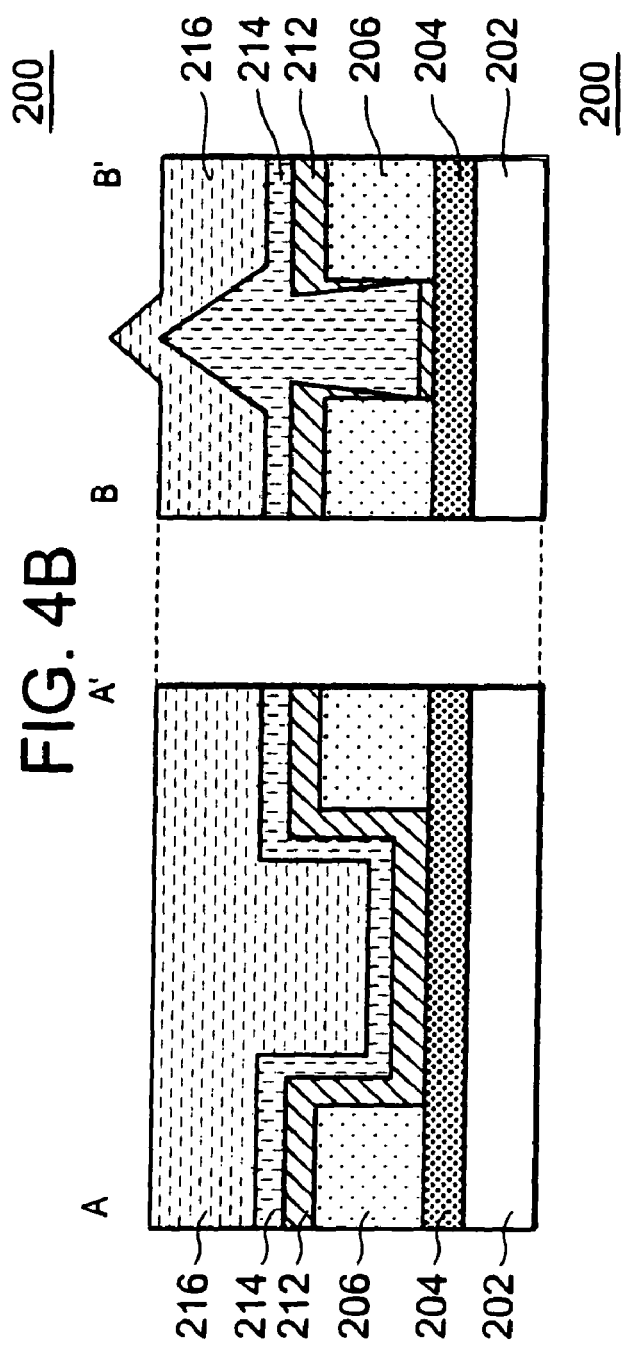

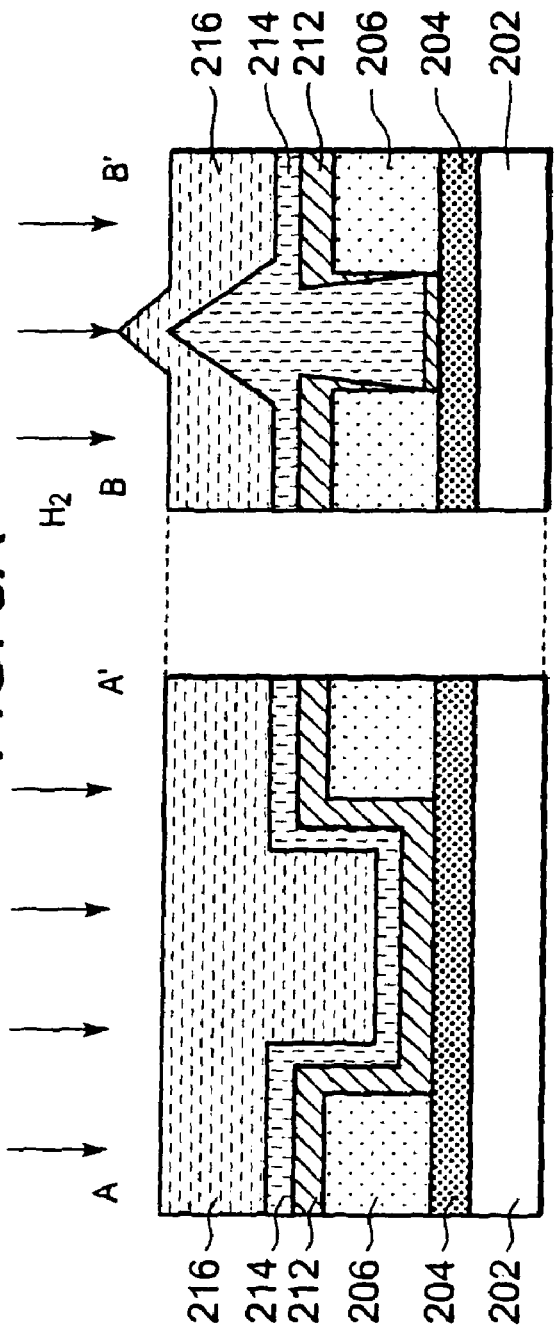
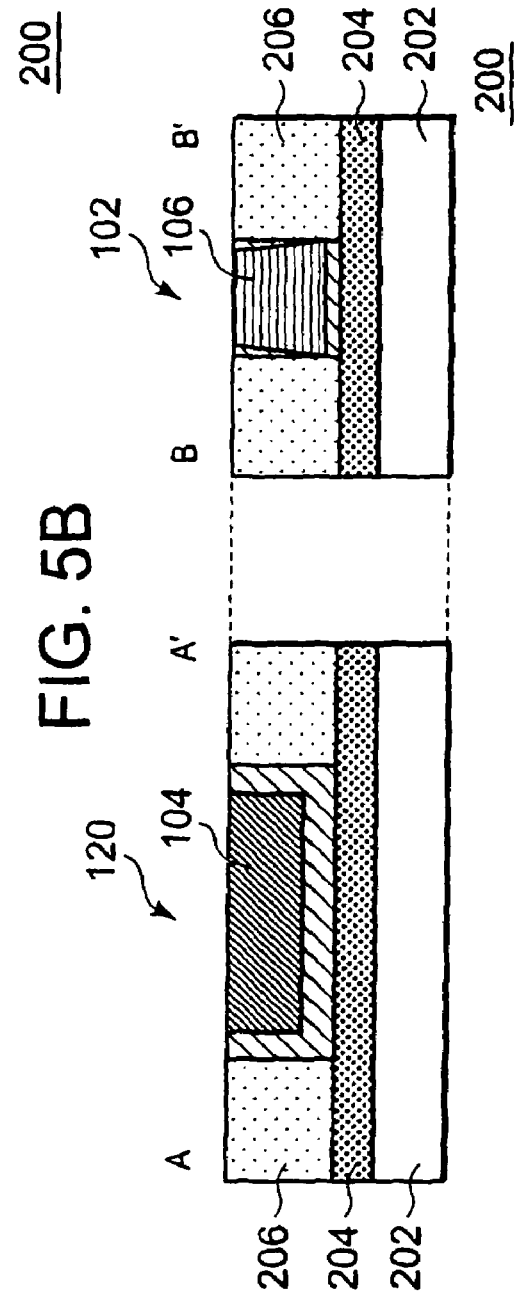

ELECTRICAL FUSE AND SEMICONDUCTOR DEVICE

BACKGROUND OF THE INVENTION

1. Field of the Invention

The present invention relates to an electrical fuse and a semiconductor device.

2. Description of the Related Art

Conventionally, there has been known a technology of cutting a fuse mounted in a semiconductor device, to thereby perform various processes including adjustment of a resistance value of the semiconductor device and detachment of a defective element to be replaced with a normal element.

As for a method involving cutting the fuse, there are known a method of irradiating a part of the fuse with a laser to cut the fuse and a method of causing a current to flow through the fuse, to thereby cut the fuse.

JP 2004-304002 A discloses the following technology. In a semiconductor device which includes a fuse including a fuse main body and two pads coupled to each other via the fuse main body, and two conductive layers respectively coupled to the two pads, a length of the fuse main body is defined so that, when the fuse is blown through application of an electrical stress between the two conductive layers, the blown portion of the fuse is positioned within the fuse main body, which is separated from an area overlapping with the conductive layer. This technology is aimed to enable more reliable fuse blow out.

Further, as an example of an electrical fuse to be cut by causing a current to flow therethrough, there is known an electrical fuse which employs a phenomenon in which its constituent material migrates due to electromigration (see, for example, JP 2005-39220 A).

The present inventor has recognized as follows. As described in JP 2005-39220 A, in the case of cutting the fuse employing a phenomenon in which its constituent material migrates due to electromigration, there is a fear that, when a semiconductor device is subjected to heat treatment after the fuse has been cut, the constituent material may migrate again due to electromigration and thus the fuse may be reconnected at the cutting portion. When such reconnection occurs, even after the cutting-target electrical fuse has been cut, accurate results may not be obtained through detection of whether or not the electrical fuse has been cut.

FIGS. 7A to 7C illustrate an example of an electrical fuse using copper as a constituent material.

FIG. 7A illustrates a structure of an electrical fuse 10 before cutting. The electrical fuse 10 includes terminals 20 and 22 and an interconnect to be cut 12 provided between the terminals 20 and 22. The interconnect to be cut 12 has a width smaller than widths of the terminals 20 and 22. When a current is caused to flow in a direction from the terminal 20 toward the terminal 22 of the electrical fuse 10, electrons migrate within the interconnect to be cut 12 in a direction from the terminal 22 toward the terminal 20 as illustrated in FIG. 7B. Along with the migration of electrons, copper forming the electrical fuse 10 migrates due to electromigration, whereby a void 30 is generated within the interconnect to be cut 12 having the smaller width. In some cases, however, the void 30 formed within the interconnect to be cut 12 which is cut utilizing electromigration is not large enough to extend over the width of the interconnect to be cut 12. As a result, there is a case where the electrical fuse 10 is not cut completely or a case where the electrical fuse 10 is reconnected due to electromigration when heat treatment is performed after the cutting, as described above.

The possibility that the reconnection as described above occurs is not so strong as to incur a problem as long as a semiconductor device is used in a normal operation. However, when significantly high reliability is required for a semiconductor device, or when a semiconductor device is used under severe conditions, it is necessary to further enhance characteristics of maintaining a cut state of the electrical fuse after cutting.

Incidentally, JP 2001-68475 A discloses a process of allowing, in an interconnect containing copper or a copper alloy layer, a majority of copper or copper alloy crystal grains to form twin crystals. Such twin crystals of the copper-based film form a coherent twin-crystal boundary. It is described in JP 2001-68475 A that an electromigration rate is low in the coherent twin-crystal boundary, and accordingly the two crystal grains forming the twin-crystal boundary may be substantially regarded as a single large crystal grain. The inventor(s) of the present invention have found that the reconnection of the electrical fuse after the cutting as described above may be prevented by using such twin crystals in the electrical fuse, and arrived at the present invention.

SUMMARY

According to one aspect of the present invention, there is provided an electrical fuse comprising:
  an interconnect to be cut; and
  a first terminal and a second terminal which are respectively provided at both ends of the interconnect to be cut,
  the interconnect to be cut comprising:
    a first orientation film which contains copper as a main component and is oriented in a (111) plane; and
    a second orientation film which contains copper as a main component and is oriented in a (511) plane,
    the second orientation film being provided inside the first orientation film over a width direction of the first orientation film, which is perpendicular to a direction from the first terminal toward the second terminal, so as to partition the first orientation film.

Further, according to another aspect of the present invention, there is provided a semiconductor device comprising:
  a substrate; and
  an electrical fuse comprising:
  an interconnect to be cut formed on the substrate; and
  a first terminal and a second terminal which are respectively provided at both ends of the interconnect to be cut,
  the interconnect to be cut comprising:
    a first orientation film which contains copper as a main component and is oriented in a (111) plane; and
    a second orientation film which contains copper as a main component and is oriented in a (511) plane,
    the second orientation film being provided inside the first orientation film over a width direction of the first orientation film, which is perpendicular to a direction from the first terminal toward the second terminal, so as to partition the first orientation film.

When a voltage is applied between the first terminal and the second terminal to cut the electrical fuse, a current flows between the first terminal and the second terminal, whereby atoms of copper diffuse along with a flow of electrons. In the above-mentioned structure, the interconnect to be cut is formed of a copper fuse which is mainly constituted by (111)-oriented grains, and (511)-oriented grains exist over the width direction perpendicular to a current advancing direction. As a result, the flow of atoms of copper is obstructed due to the (511)-oriented grains. Therefore, it becomes possible to form a large void extending over a fuse width on a downstream side of the second orientation film which is constituted by the (511)-oriented grains. With this structure, the electrical fuse may be prevented from being reconnected due to subsequent heat treatment or the like. Besides, the void extends over the electrical fuse width, thereby enabling the electrical fuse to be cut securely, which also makes it possible to eliminate variation in cut voltage required for cutting the electrical fuse.

It is to be noted that a method or a device in which the above-mentioned constituent components are appropriately combined or to which description of the present invention is adapted is also effective as an aspect of the present invention.

According to the present invention, it becomes possible to securely cut the electrical fuse whose constituent material is copper, and moreover, to maintain a satisfactory cut state of the electrical fuse after the cutting.

BRIEF DESCRIPTION OF THE DRAWINGS

The above and other objects, advantages and features of the present invention will be more apparent from the following description of certain preferred embodiments taken in conjunction with the accompanying drawings, in which:

FIGS. 3A and 3B are cross sections illustrating a process of a manufacturing procedure for a semiconductor device including the electrical fuse according to the embodiment of the present invention;

FIGS. 4A and 4B are cross sections illustrating the process of the manufacturing procedure for the semiconductor device including the electrical fuse according to the embodiment of the present invention;

FIGS. 5A and 5B are cross sections illustrating the process of the manufacturing procedure for the semiconductor device including the electrical fuse according to the embodiment of the present invention;

DETAILED DESCRIPTION OF THE PREFERRED EMBODIMENT

Referring to the accompanying drawings, an embodiment of the present invention is described below. It is noted that the same constituent components are denoted by the same reference symbols throughout the drawings, and description thereof is omitted as appropriate.

Figure 1:
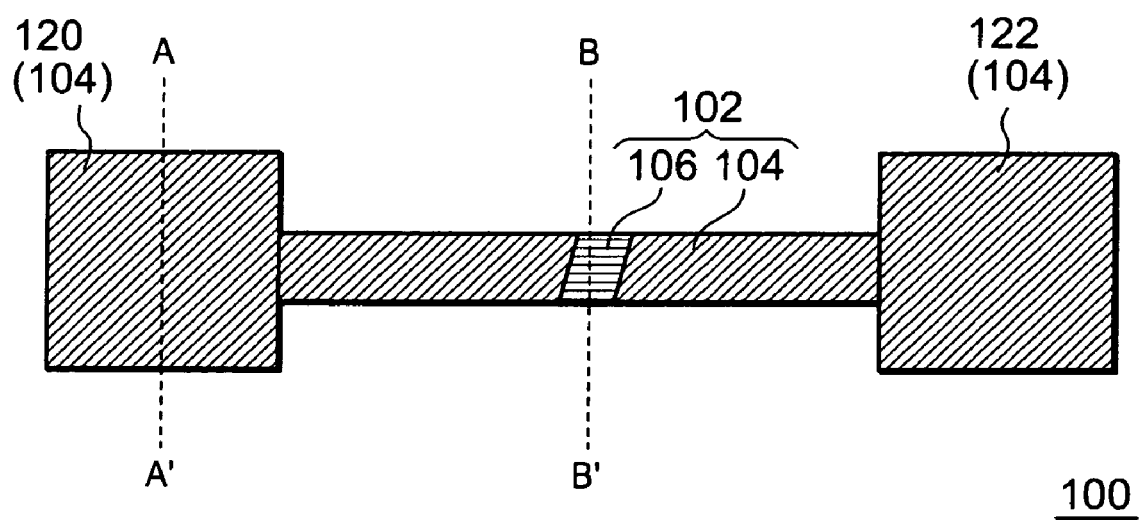
FIG. 1 is a plan view illustrating a structure of an electrical fuse according to an embodiment of the present invention.

FIG. 1 is a plan view illustrating a structure of an electrical fuse according to this embodiment.

An electrical fuse 100 includes an interconnect to be cut 102 having a linear shape, and a first terminal 120 and a second terminal 122 which are respectively provided at both ends of the interconnect to be cut 102. In this embodiment, the electrical fuse 100 contains copper as a main component.

The interconnect to be cut 102 includes a first orientation film 104 which contains copper as a main component and is oriented in a (111) plane, and a second orientation film 106 which is provided inside the first orientation film 104, contains copper as a main component, and is oriented in a (511) plane. In this embodiment, the second orientation film 106 is provided inside the first orientation film 104 over a width direction which is perpendicular to a direction from the first terminal 120 toward the second terminal 122, so as to partition the first orientation film 104. In other words, in a certain portion of the interconnect to be cut 102 having the linear shape, the second orientation film 106 is provided over a width direction of the interconnect to be cut 102. The first terminal 120 and the second terminal 122 are mainly formed of the first orientation film 104.

The first orientation film 104 and the second orientation film 106 may contain a different element other than copper. The different element may be one or two or more elements selected from Al, Ag, W, Mg, Be, Zn, Pd, Cd, Au, Hg, Pt, Si, Zr, Ti, and Sn. In a case of using Al as the different element, the element is deposited on a surface of the electrical fuse, which makes it possible to suppress copper from diffusing in a horizontal direction after the electrical fuse has been cut. In a case of using Be, Mg, Zn, Pd, Ag, Cd, Au, Pt, or Hg as the different element, an increasing rate of resistance of the copper-containing metal film may be suppressed to be low. In a case of using Zr or Ti as the different element, adhesion between the metal film, and an insulating film and a barrier metal film may be enhanced. In a case of using, as the different element, metal that is lower in oxidation-reduction potential than copper, such as Mg, Sn, Zn, or Cd, a surface of the metal film may be prevented from corroding.

Figure 2A:
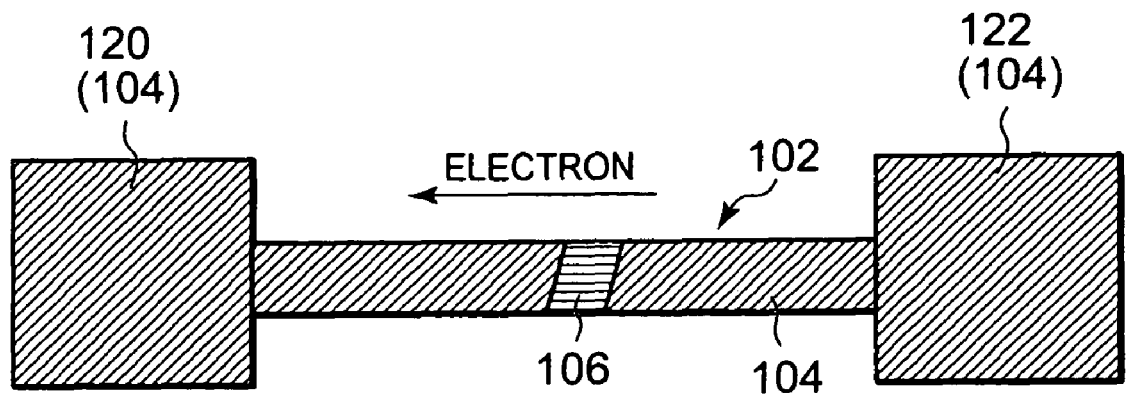
FIGS. 2A and 2B illustrate a procedure of cutting the electrical fuse according to the embodiment of the present invention by causing a current to flow through the electrical fuse.
Figure 2B:
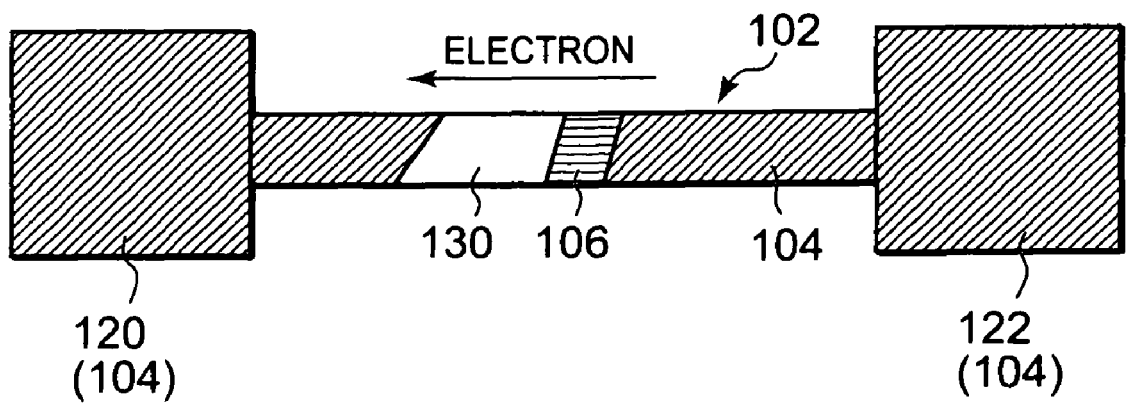

FIGS. 2A and 2B illustrate a procedure of cutting the electrical fuse 100 having the above-mentioned structure by causing a current to flow through the electrical fuse 100.

A high voltage is applied to the first terminal 120 while the second terminal 122 is grounded, to thereby cause a current to flow in a direction from the first terminal 120 toward the second terminal 122. Electrons flow in a direction reverse to the direction of the current, and hence electrons migrate within the interconnect to be cut 102 in the direction from the second terminal 122 toward the first terminal 120 (FIG. 2A). Atoms of copper constituting the interconnect to be cut 102 also diffuse along the flow direction of electrons. In this embodiment, over a direction (hereinafter also referred to as fuse width) perpendicular to the migration direction of copper, there exists the second orientation film 106 which contains copper and is orientated in the (511) plane. Therefore, when the atoms of copper diffuse in the direction from the second terminal 122 toward the first terminal 120, the flow of atoms of copper is obstructed due to the second orientation film 106. As a result, a large void 130 extending over the fuse width is formed on a downstream side of the flow of atoms of copper with respect to the second orientation film 106 as illustrated in FIG. 2B.

With the structure described above, it becomes possible to reduce variation in cut voltage required for cutting the interconnect to be cut 102, and moreover, to prevent the interconnect to be cut 102 from being reconnected when heat treatment is performed after the cutting of the electrical fuse 100.

Next, a manufacturing procedure for the electrical fuse 100 according to this embodiment is described.

FIGS. 3A and 3B each illustrate a cross section taken along the line A-A' of FIG. 1 and a cross section taken along the line B-B' of FIG. 1. In the respective drawings, the A-A' cross section is illustrated on the left while the B-B' cross section is illustrated on the right.

In this embodiment, a case of forming the electrical fuse 100 on a semiconductor substrate 202 (substrate) is described by way of example. A semiconductor device 200 includes the semiconductor substrate 202, an etching blocking film 204 formed on the semiconductor substrate 202, and an interlayer insulating film 206 formed on the etching blocking film 204. The semiconductor substrate 202 is, for example, a silicon substrate.

First, recess portions in which the electrical fuse 100 is formed are formed in the interlayer insulating film 206. Here, the recess portions are illustrated as a terminal recess portion 208 in which the first terminal 120 (or second terminal 122) is formed and an interconnect-to-be-cut recess portion 210 in which the interconnect to be cut 102 is formed (FIG. 3A). The terminal recess portion 208 is formed so as to be larger in width than the interconnect-to-be-cut recess portion 210. For example, the width of the terminal recess portion 208 is set to approximately 270 nm to 600 nm while the width of the interconnect-to-be-cut recess portion 210 is set to approximately 90 nm to 200 nm, which means that the terminal recess portion 208 may have the width approximately three times the width of the interconnect-to-be-cut recess portion 210. In addition, the terminal recess portion 208 may have a depth substantially equal to that of the interconnect-to-be-cut recess portion 210.

Subsequently, a barrier metal film 212 is formed on an entire surface over the semiconductor substrate 202 (FIG. 3B). The barrier metal film 212 contains refractory metal such as Ti, W, and Ta. The barrier metal film 212 may be made of Ti, TiN, W, WN, Ta, or TaN, or a laminated film thereof. A film made of tantalum barrier metal, which is a laminated film of a TaN film and a Ti film, is suitably used for the barrier metal film 212. In the terminal recess portion 208 having the larger interconnect width, the barrier metal film 212 is formed thicker. For this reason, when a TaN film is used for the barrier metal film 212, it becomes possible to increase a nitrogen content of the barrier metal film 212. Accordingly, when copper films are formed on the barrier metal film 212 to start crystal growth, the copper films may be easily oriented in a (111) plane.

Further, though not illustrated in FIG. 3B, a seed metal film is formed on the barrier metal film 212. The seed metal film may be formed by sputtering or the like. The seed metal film may be made of copper alone, or an alloy of copper and a different element other than copper.

Next, a first copper plating film 214 is formed on an entire surface over the semiconductor substrate 202 at low rate (for example, 30 A/sec) (FIG. 4A). The first copper plating film 214 may be formed by electrolytic plating using a copper sulfate solution. In this case, to achieve a high bottom-up quality, an additive concentration of the copper sulfate solution needs to be high, and hence a concentration of impurities such as O and the like contained in the first copper plating film 214 is set to high.

Subsequently, a second copper plating film 216 is formed on an entire surface over the semiconductor substrate 202 at high rate (for example, 300 A/sec) (FIG. 4B). The second copper plating film 216 may be formed by electrolytic plating using a copper sulfate solution. In this case, the growth rate of the second copper plating film 216 is high, and accordingly a concentration of impurities such as O and the like contained in the second copper plating film 216 becomes lower than in the first copper plating film 214. The interconnect-to-be-cut recess portion 210 with the smaller width is almost completely embedded with the first copper plating film 214. On the other hand, the first copper plating film 214 is formed only on a wall of the terminal recess portion 208 with the wider width whereas most part of the terminal recess portion 208 is embedded with the second copper plating film 216.

In this state, annealing is performed at around 250° C. for approximately 5 minutes in a gas mixture of $H_2$ and $N_2$ (FIG. 5A) Here, the annealing is performed using a reducing gas such as a hydrogen gas ($H_2$), and hence impurities contained in the first and second copper plating films 214 and 216, especially $O_2$ and the like, are reduced, whereby pure copper films are formed to be easily oriented in a (111) plane. As a result, an area of copper oriented in a (511) plane, which is a twin crystal of the (111) plane-oriented copper, is increased as well as an area of the copper film oriented in the (111) plane.

Further, in this case, in each of the first terminal 120 and the second terminal 122, a concentration of impurities within the films is lower than that in the interconnect to be cut 102. Therefore, a grain growth rate in the first terminal 120 and the second terminal 122 is higher than that in the interconnect to be cut 102. This state is illustrated in FIGS. 6A and 6B.

Figure 6A:
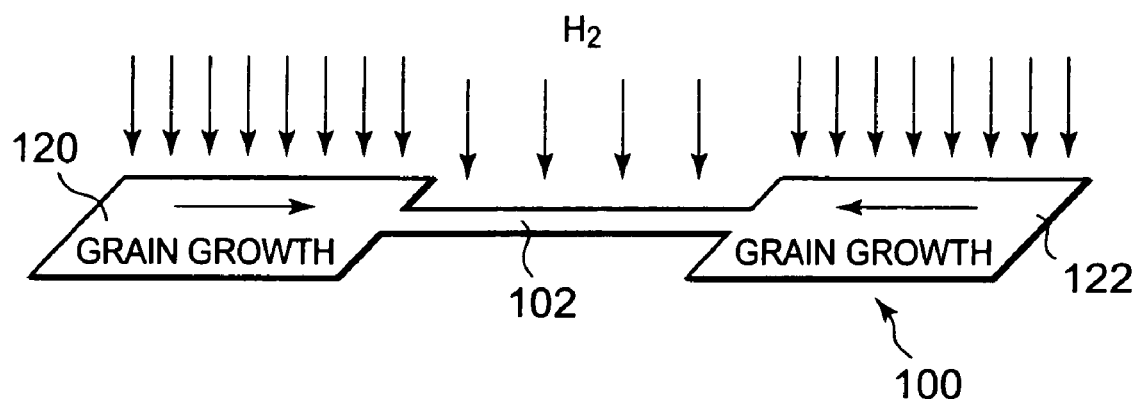
FIGS. 6A and 6B are schematic views for describing a grain growth rate when the electrical fuse is formed.
Figure 6B:
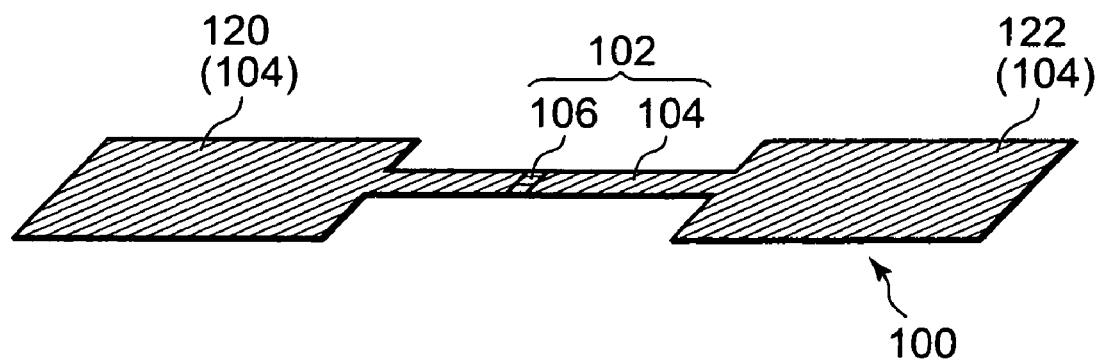
Figure 7A:
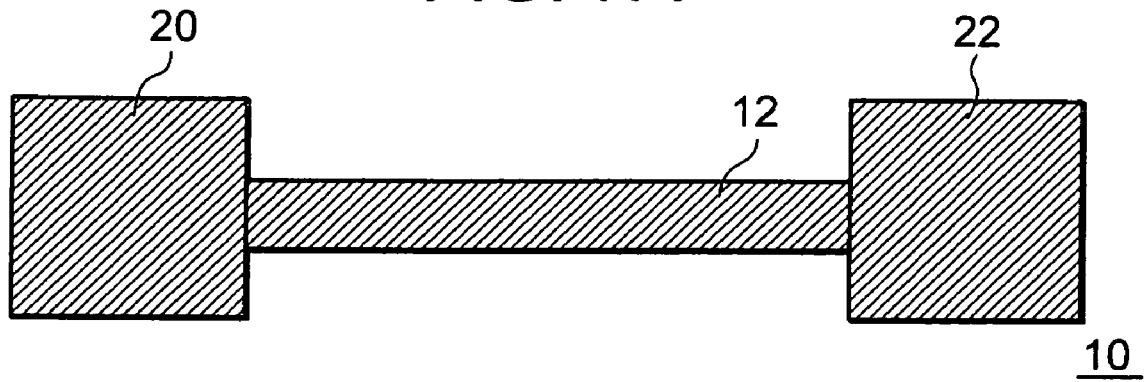
FIGS. 7A to 7C are schematic views for describing a problem when a conventional electrical fuse is cut.
Figure 7B:
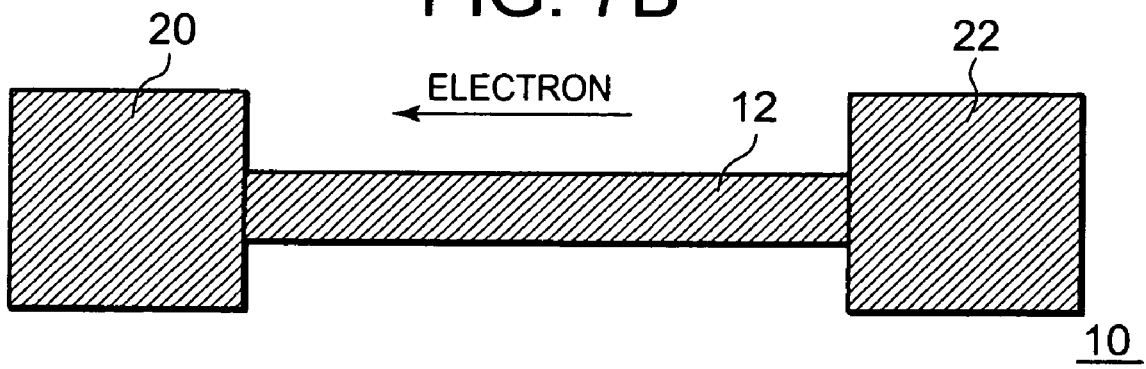
Figure 7C:
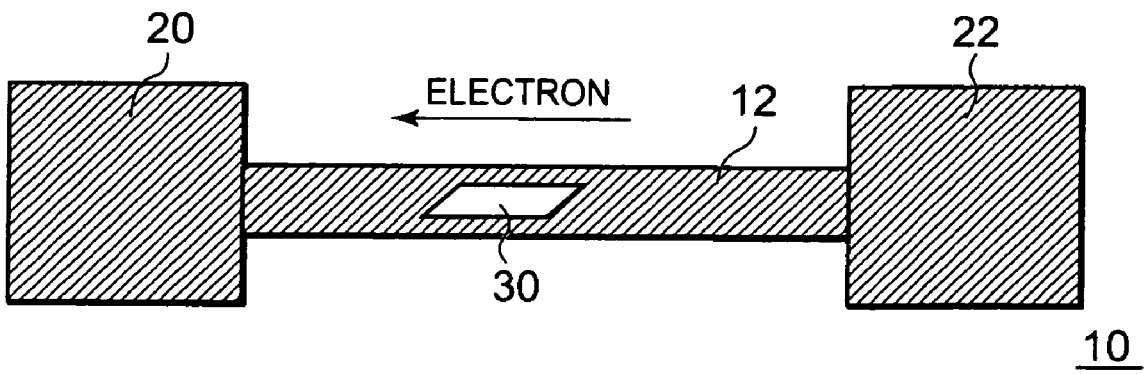

As illustrated in FIG. 6A, grains start to grow from the first terminal 120 and the second terminal 122. As described above, when a TaN film is used for the barrier metal film 212, a nitrogen content of the barrier metal film 212 becomes large in the first terminal 120 and the second terminal 122. In addition, the copper films of the first terminal 120 and the second terminal 122 are irradiated with a reducing gas, and therefore are easily oriented in the (111) plane. As a result, crystal grains oriented in the (111) plane start to grow from the first terminal 120 and the second terminal 122 toward the interconnect to be cut 102, whereby a grain boundary exists in the interconnect to be cut 102. Then, copper oriented in the (511) plane which is present in the grain boundary is concentrated in the interconnect to be cut 102. As a result, as illustrated in FIG. 6B, the second orientation film 106 extending over the fuse width is formed in the vicinity of the center of the interconnect to be cut 102, which is an area in which the growth of the grains from the first terminal 120 and the growth of the grains from the second terminal 122 collide with each other.

Referring back to FIG. 5B, after the annealing has been performed, the plating films which are exposed outside the terminal recess portion 208 and the interconnect-to-be-cut recess portion 210 are removed by chemical mechanical polishing (CMP) or the like, to thereby form the electrical fuse constituted by the interconnect to be cut 102, the first terminal 120, and the second terminal 122 (those are not shown individually in FIG. 5B).

Thereafter, it is also possible to irradiate an entire surface of the semiconductor device 200 with silane. In this case, the irradiated silane is dissolved into a boundary between the first orientation film 104 and the second orientation film 106, which makes it possible to enhance the effect of obstructing the flow of atoms of copper with the aid of the second orientation film 106 after the electrical fuse 100 has been cut.

Next, effects of the electrical fuse 100 according to this embodiment are described.

As described above, the second orientation film 106 is provided over the fuse width of the interconnect to be cut 102, which makes it possible to form the large void 130 extending over the fuse width on the downstream side of the flow of electrons with respect to the second orientation film 106 when the electrical fuse 100 is cut. Accordingly, it becomes possible to cut the electrical fuse 100 securely to reduce variation in cut voltage required for the electrical fuse 100. Moreover, it becomes possible to prevent the electrical fuse 100 from being reconnected when heat treatment is performed after the cutting of the electrical fuse 100.

As described above, when the electrical fuse 100 is cut by causing a current to flow therethrough, in order to cut the electrical fuse 100 securely and to prevent the reconnection of the electrical fuse 100, it is necessary to form the second orientation film 106 over the fuse width of the interconnect to be cut 102 of the electrical fuse 100. With the above-mentioned manufacturing procedure for the semiconductor device 200 according to this embodiment, it becomes possible to easily form, in the first terminal 120 and the second terminal 122, the first orientation film 104 oriented in the (111) plane. Moreover, it becomes possible to form, within the interconnect to be cut 102, the second orientation film 106 over the fuse width of the interconnect to be cut 102.

The embodiment of the present invention has been described above with reference to the accompanying drawings. However, the above-mentioned embodiment is merely illustrative of the present invention, and various modifications may be made thereto.

What is claimed is:

1. An electrical fuse, comprising:
an interconnect to be cut; and
a first terminal and a second terminal which are respectively provided at both ends of the interconnect to be cut,
the interconnect to be cut comprising:
  a first orientation film which contains copper as a main component and is oriented in a (111) plane; and
  a second orientation film which contains copper as a main component and is oriented in a (511) plane,
  the second orientation film being provided inside the first orientation film over a width direction of the first orientation film, which is perpendicular to a direction from the first terminal toward the second terminal, so as to partition the first orientation film.

2. An electrical fuse according to claim 1, wherein:
the first terminal and the second terminal are each formed larger in width than the interconnect to be cut;
the first terminal and the second terminal mainly include the first orientation film; and
a content of the second orientation film within the interconnect to be cut with respect to the first orientation film is larger than a content of the second orientation film within the first terminal and the second terminal with respect to the first orientation film.

3. An electrical fuse according to claim 1, wherein the second orientation film contains a different element other than copper.

4. An electrical fuse according to claim 1, wherein the first orientation film contains a different element other than copper.

5. A semiconductor device, comprising:
a substrate; and
an electrical fuse comprising:
  an interconnect to be cut formed on the substrate; and
  a first terminal and a second terminal which are respectively provided at both ends of the interconnect to be cut,
  the interconnect to be cut comprising:
    a first orientation film which contains copper as a main component and is oriented in a (111) plane; and
    a second orientation film which contains copper as a main component and is oriented in a (511) plane,
    the second orientation film being provided inside the first orientation film over a width direction of the first orientation film, which is perpendicular to a direction from the first terminal toward the second terminal, so as to partition the first orientation film.

6. A semiconductor device according to claim 5, wherein:
the first terminal and the second terminal are each formed larger in width than the interconnect to be cut;
the first terminal and the second terminal mainly include the first orientation film; and
a content of the second orientation film within the interconnect to be cut with respect to the first orientation film is larger than a content of the second orientation film within the first terminal and the second terminal with respect to the first orientation film.

7. A semiconductor device according to claim 5, wherein the second orientation film contains a different element other than copper.

8. A semiconductor device according to claim 5, wherein the first orientation film contains a different element other than copper.

* * * * *